(12) United States Patent
Hines et al.

(10) Patent No.: US 7,688,525 B2
(45) Date of Patent: Mar. 30, 2010

(54) HYBRID PRIMARY OPTICAL COMPONENT FOR OPTICAL CONCENTRATORS

(75) Inventors: Braden E. Hines, Pasadena, CA (US); Richard L. Johnson, Jr., Suffolk, VA (US)

(73) Assignee: Soliant Energy, Inc., Pasadena, CA (US)

( * ) Notice: Subject to any disclaimer, the term of this patent is extended or adjusted under 35 U.S.C. 154(b) by 483 days.

(21) Appl. No.: 11/654,131

(22) Filed: Jan. 17, 2007

(65) Prior Publication Data

US 2007/0188876 A1   Aug. 16, 2007

Related U.S. Application Data

(60) Provisional application No. 60/759,909, filed on Jan. 17, 2006.

(51) Int. Cl.
*G02B 17/00* (2006.01)

(52) U.S. Cl. .................. 359/726; 359/727; 126/689

(58) Field of Classification Search .......... 359/726, 359/727, 729; 126/698, 628, 439, 246; 136/246
See application file for complete search history.

(56) References Cited

U.S. PATENT DOCUMENTS

| | | | |
|---|---|---|---|
| 3,388,739 A | 6/1968 | Olson et al. | |
| 3,957,031 A | 5/1976 | Winston | |
| 4,000,734 A | 1/1977 | Matlock et al. | |
| 4,002,499 A | 1/1977 | Winston | |
| 4,003,638 A | 1/1977 | Winston | |
| 4,022,186 A | 5/1977 | Northrup, Jr. | |
| 4,067,764 A | 1/1978 | Walker et al. | |
| 4,069,812 A | 1/1978 | O'Neill | |
| 4,092,531 A | 5/1978 | Moss | |
| 4,107,521 A | 8/1978 | Winders | |
| 4,131,485 A | 12/1978 | Meinel et al. | |
| 4,146,785 A | 3/1979 | Neale | |
| 4,158,356 A | 6/1979 | Wininger | |
| 4,168,696 A | 9/1979 | Kelly | |
| 4,169,738 A | 10/1979 | Luque | |

(Continued)

FOREIGN PATENT DOCUMENTS

DE   4116894   11/1992

(Continued)

OTHER PUBLICATIONS http://www.nrel.gov/docs/fy99osti/25410.pdf(Kurtz et al., "Concentrator and Space Applications of High-Efficiency Solar Cells—Recent Developments," Presented at the National Center for Photovoltaics Program Review Meeting, Denver, Colorado, Sep. 1998) 9 pages.

(Continued)

*Primary Examiner*—Timothy J Thompson
(74) *Attorney, Agent, or Firm*—Kagan Binder, PLLC

(57) ABSTRACT

A hybrid optical component that collects and concentrates incident light. The hybrid component includes both refractive and reflective elements. In preferred embodiments, refractive and reflective components focus rays on a common focal plane generally located at the bottom of the reflector where they are absorbed by a device such as a photovoltaic (solar) cell. Additionally, the optical component combines both imaging and non-imaging optical elements into a single device, for improved overall performance.

38 Claims, 9 Drawing Sheets

U.S. PATENT DOCUMENTS

| | | | |
|---|---|---|---|
| 4,177,083 A | 12/1979 | Kennedy | |
| 4,184,482 A | 1/1980 | Cohen | |
| 4,187,123 A | 2/1980 | Diggs | |
| 4,191,164 A * | 3/1980 | Kelly | 126/683 |
| 4,210,121 A | 7/1980 | Stark | |
| 4,211,212 A | 7/1980 | Braun | |
| 4,215,410 A | 7/1980 | Weslow et al. | |
| 4,223,174 A | 9/1980 | Moeller | |
| 4,238,246 A | 12/1980 | Genequand et al. | |
| 4,253,880 A | 3/1981 | Bellugue | |
| 4,256,364 A | 3/1981 | Minoura et al. | |
| 4,262,195 A | 4/1981 | White et al. | |
| 4,269,168 A | 5/1981 | Johnson | |
| 4,280,853 A | 7/1981 | Palazzetti et al. | |
| 4,287,411 A | 9/1981 | Beucci | |
| 4,296,731 A | 10/1981 | Cluff | |
| 4,297,521 A | 10/1981 | Johnson | |
| 4,307,711 A | 12/1981 | Doundoulakis | |
| 4,320,288 A | 3/1982 | Schlarlack | |
| 4,323,052 A | 4/1982 | Stark | |
| 4,328,789 A | 5/1982 | Nelson | |
| 4,349,733 A | 9/1982 | Beam et al. | |
| 4,354,484 A | 10/1982 | Malone et al. | |
| 4,365,617 A | 12/1982 | Bugash et al. | |
| 4,397,303 A | 8/1983 | Stultz | |
| 4,398,053 A | 8/1983 | Orillion | |
| 4,410,757 A | 10/1983 | Stamminger et al. | |
| 4,459,972 A | 7/1984 | Moore | |
| 4,476,854 A | 10/1984 | Baer | |
| 4,484,334 A | 11/1984 | Pressley | |
| 4,495,408 A | 1/1985 | Mori | |
| 4,554,038 A | 11/1985 | Allard | |
| 4,556,788 A | 12/1985 | Hanak | |
| 4,572,161 A | 2/1986 | Mori | |
| 4,575,639 A | 3/1986 | Rogow et al. | |
| 4,601,282 A | 7/1986 | Mountain | |
| 4,604,494 A | 8/1986 | Shepard, Jr. | |
| 4,619,244 A | 10/1986 | Marks | |
| 4,622,470 A | 11/1986 | Makino et al. | |
| 4,750,943 A | 6/1988 | Nelson | |
| 4,771,764 A | 9/1988 | Cluff | |
| 4,868,379 A | 9/1989 | West | |
| 4,945,731 A | 8/1990 | Parker et al. | |
| 4,968,355 A | 11/1990 | Johnson | |
| 4,995,377 A | 2/1991 | Eiden | |
| 4,999,483 A | 3/1991 | Okamoto | |
| 5,255,666 A | 10/1993 | Curchod | |
| 5,317,145 A | 5/1994 | Corio | |
| 5,483,060 A | 1/1996 | Sugiura et al. | |
| 5,498,297 A | 3/1996 | O'Neill et al. | |
| 5,665,174 A | 9/1997 | Laing et al. | |
| 5,727,585 A | 3/1998 | Daume et al. | |
| 5,806,955 A | 9/1998 | Parkyn, Jr. et al. | |
| 5,977,475 A | 11/1999 | Hibino | |
| 6,020,554 A | 2/2000 | Kaminar et al. | |
| 6,058,930 A | 5/2000 | Shingleton | |
| 6,079,408 A | 6/2000 | Fukuda | |
| 6,087,646 A | 7/2000 | Didinsky | |
| 6,089,224 A | 7/2000 | Poulek | |
| 6,113,342 A | 9/2000 | Smith et al. | |
| 6,127,620 A | 10/2000 | Tange et al. | |
| 6,498,290 B1 | 12/2002 | Lawheed | |
| 6,531,653 B1 | 3/2003 | Glenn et al. | |
| 6,620,995 B2 | 9/2003 | Vasylyev et al. | |
| 6,680,693 B2 | 1/2004 | Urban et al. | |
| 6,691,701 B1 | 2/2004 | Roth | |
| 6,700,054 B2 | 3/2004 | Cherney et al. | |
| 6,717,045 B2 | 4/2004 | Chen | |
| 6,809,413 B1 | 10/2004 | Peterson et al. | |
| 6,843,573 B2 | 1/2005 | Rabinowitz et al. | |
| 6,848,442 B2 | 2/2005 | Haber | |
| 6,870,087 B1 | 3/2005 | Gallagher | |
| 6,881,893 B1 | 4/2005 | Cobert | |
| 6,903,261 B2 | 6/2005 | Habraken et al. | |
| 6,959,993 B2 | 11/2005 | Gross et al. | |
| 6,963,437 B2 | 11/2005 | Bauer et al. | |
| 6,971,756 B2 | 12/2005 | Vasylyev et al. | |
| 7,055,519 B2 | 6/2006 | Litwin | |
| 7,076,965 B2 | 7/2006 | Lasich | |
| 7,109,461 B2 | 9/2006 | Lasich | |
| 7,156,088 B2 | 1/2007 | Luconi | |
| 7,188,964 B2 | 3/2007 | Ealey | |
| 7,192,146 B2 | 3/2007 | Gross et al. | |
| 7,218,998 B1 | 5/2007 | Neale | |
| 7,388,146 B2 | 6/2008 | Fraas et al. | |
| 7,403,278 B2 * | 7/2008 | Hayashi et al. | 356/237.1 |
| 7,432,438 B2 | 10/2008 | Rubin et al. | |
| 7,442,871 B2 | 10/2008 | Meyers | |
| 7,535,071 B2 | 5/2009 | Schell et al. | |
| 2003/0201007 A1 | 10/2003 | Fraas et al. | |
| 2003/0201008 A1 | 10/2003 | Lawheed | |
| 2004/0187907 A1 | 9/2004 | Morgal | |
| 2004/0216734 A1 | 11/2004 | Lawheed | |
| 2005/0081908 A1 | 4/2005 | Stewart | |
| 2005/0126560 A1 | 6/2005 | Litwin | |
| 2005/0229924 A1 | 10/2005 | Luconi et al. | |
| 2005/0241692 A1 | 11/2005 | Rubin et al. | |
| 2006/0054211 A1 | 3/2006 | Meyers | |
| 2006/0054212 A1 | 3/2006 | Fraas et al. | |
| 2006/0060188 A1 | 3/2006 | Hickerson | |
| 2006/0283495 A1 | 12/2006 | Gibson | |
| 2006/0283497 A1 | 12/2006 | Hines | |
| 2007/0070531 A1 | 3/2007 | Lu | |
| 2007/0089777 A1 | 4/2007 | Johnson, Jr. et al. | |
| 2007/0102037 A1 | 5/2007 | Irwin | |
| 2007/0108459 A1 | 5/2007 | Lu | |
| 2007/0193620 A1 | 8/2007 | Hines et al. | |
| 2007/0272234 A1 | 11/2007 | Allen et al. | |
| 2008/0023061 A1 | 1/2008 | Clemens et al. | |
| 2008/0078380 A1 | 4/2008 | Kimura et al. | |
| 2008/0083405 A1 | 4/2008 | Kimura et al. | |
| 2008/0127967 A1 | 6/2008 | Kimura et al. | |
| 2008/0128586 A1 | 6/2008 | Johnson et al. | |
| 2008/0135096 A1 | 6/2008 | Johnson | |
| 2008/0142078 A1 | 6/2008 | Johnson | |
| 2008/0185032 A1 | 8/2008 | MacDonald | |
| 2009/0000612 A1 | 1/2009 | Hines et al. | |
| 2009/0000662 A1 | 1/2009 | Harwood et al. | |

FOREIGN PATENT DOCUMENTS

| | | |
|---|---|---|
| DE | 9412438 | 6/1995 |
| DE | 10150176 | 4/2003 |
| EP | 0 474349 A2 | 3/1992 |
| EP | 1041628 | 10/2000 |
| FR | 2291506 | 6/1976 |
| FR | 2447017 | 8/1980 |
| FR | 2527748 | 12/1983 |
| JP | 56023666 | 3/1981 |
| JP | 56058278 | 5/1981 |
| JP | 58098984 | 6/1983 |
| JP | 06085301 | 3/1994 |
| JP | 06085304 | 3/1994 |
| JP | 2002141543 | 5/2002 |
| JP | 2002151711 | 5/2002 |
| WO | WO 90/04142 | 4/1990 |
| WO | WO 00/68628 | 11/2000 |
| WO | WO 01/63665 | 8/2001 |
| WO | WO 2004/114419 | 12/2004 |
| WO | WO 2005/090873 | 9/2005 |
| WO | WO 2005/119133 | 12/2005 |
| WO | WO 2006/114457 | 11/2006 |
| WO | WO 2006/120475 | 11/2006 |

WO  WO 2007/041018  4/2007

OTHER PUBLICATIONS

Swanson, "The Promise of Concentrators," Prog. Photovolt. Res. Appl., vol. 8, pp. 93-111 (2000).
Kurtz and Friedman, "Photovoltaics-Lighting the Way to a Brighter Future," Optics & Photons News, pp. 30-35, Jun. 2005.
Burge et al., "Lightweight Mirror Technology Using a Thin Facesheet With Active Rigid Support," Proc. SPIE 3356, Space Telescopes and Instruments V, pp. 690-701, 1998.

Cho et al., "Optimization of the ATST Primary Mirror Support System," Proc. SPIE 6273, Optomechanical Technologies for Astronomy, 2006.
Richman, R.H. et al., "Investigation of high-concentration photovoltaic cell packages after three years field service," Solar Energy Materials and Solar Cells 30, No. 3, pp. 263-276, Aug. 1993.
Prisms & Flats from Pacific Rim Optical, Inc., http://www.krugeroptical.com/pro_prisms.asp, copyright 2009, 1 page.

* cited by examiner

HYBRID PRIMARY OPTICAL COMPONENT FOR OPTICAL CONCENTRATORS

PRIORITY CLAIM

The present non-provisional patent Application claims priority under 35 USC §119(e) from U.S. Provisional Patent Application having Ser. No. 60/759,909, filed on Jan. 17, 2006, by Hines et al., and titled A HYBRID PRIMARY OPTICAL COMPONENT FOR OPTICAL CONCENTRATORS, wherein the entirety of said provisional patent application is incorporated herein by reference.

FIELD OF THE INVENTION

This invention relates to optical configurations applied to optical concentrating systems, such as line or point solar collectors that receive and concentrate incident light towards target(s). The target(s) may be device(s) such as photovoltaic (solar) cell(s).

BACKGROUND OF THE INVENTION

Optical concentrating systems, such as solar collectors, concentrate light toward a focus of the optical system. In general, there are two categories of concentrators. Line concentrators concentrate incident light in one dimension so that the focus is a line. Point concentrators concentrate incident light in two dimensions so that the focus is a point.

Concentrators may include one or more optical components to concentrate incident light. Some systems have a single concentrating optical component, referred to as the primary optic, that concentrates rays directly onto the desired target (which may be a device such as a photovoltaic cell) after being collected and focused by the optic. More complex concentrators may include both a primary optic and additional optics to provide further collection or concentration abilities or improve beam uniformity at the target.

A primary optic for an optical concentrator typically includes either a refractive component or a reflective component. The most common refractive component employed is a Fresnel lens, as in O'Neill, U.S. Pat. No. 4,069,812, while a common reflective component is a parabolic reflector. With respect to refractive components, Fresnel lenses are usually preferred over standard lenses, because Fresnel lenses are thinner for a given aperture. As such, Fresnel lenses allow large collecting apertures without requiring as much lens material as does a standard lens. The system aperture for these concentrators is defined by the aperture of the Fresnel lens. FIG. 2 illustrates a typical Fresnel lens concentrator having optical axis 24, showing a Fresnel lens 18 bending light rays 20 towards a desired focus 16.

Large, high quality Fresnel lenses as conventionally used, however, can be prohibitively expensive for medium scale applications such as commercial rooftop systems. In addition, surface discontinuities present on Fresnel lenses tend to make them lossy (i.e., inasmuch as some of the light that is desirably focused may instead be absorbed and/or directed away from the focus) compared to standard lenses or reflective solutions. Another disadvantage of the Fresnel concentrator as conventionally used is that it is not suitable by itself for certain articulating concentrators that require self-powering. Such devices require a means to generate power when the optical axis of the concentrator is not aligned with the sun thereby relying on diffuse radiation from the sky. Unfortunately, a conventional Fresnel concentrator provides negligible paths for diffuse radiation to strike a solar cell located at the focus of the lens and therefore is usually unable to generate sufficient power to articulate itself when not aligned with the sun.

Reflective primaries are known to include compound parabolic concentrators (CPCs) as per Winston, U.S. Pat. No. 4,003,638 well as various types of parabolic or nearly parabolic troughs and dishes. CPCs provide good beam uniformity at the focal plane. Troughs and dishes are the two main types of CPC's. Troughs and dishes may have a bottom focus wherein the optical target, for example a solar cell, is facing up. Troughs and dishes with a bottom focus advantageously may collect and concentrate diffuse light even when the reflector is not directly aimed at the source(s) of the diffuse light. This makes them suitable for collecting diffuse light used for self-power. Troughs and dishes also may have an inverted focus wherein the optical target, for example a solar cell, is facing down, often suspended above the reflector.

However, because high concentration ratios tend to require a CPC with a large height/width ratio, the packing density for multiple articulating concentrators including CPC's can be limited. For example, FIG. 3 of the present application schematically illustrates a typical bottom focus CPC 28 with a geometric concentration of 10× in one dimension. Incident rays 30 are concentrated onto focal plane 26 with a normalized width of 1. The normalized height of the CPC 28 is 17.8, resulting in a height/width ratio of 1.78.

This relatively high height/width ratio factor makes conventional CPC's, by themselves, poorly suited for multiple articulating concentrator systems such as those described in Assignee's U.S. Provisional Patent Application No. 60/691,319, filed Jun. 16, 2005, in the names of Hines et al., titled PLANAR CONCENTRATING PHOTOVOLTAIC SOLAR PANEL WITH INDIVIDUALLY ARTICULATING CONCENTRATOR ELEMENTS and Assignee's U.S. Provisional Patent Application No. 60/759,778, filed Jan. 17, 2006, in the name of Hines, titled CONCENTRATING SOLAR PANEL AND RELATED SYSTEMS AND METHODS, which applications are incorporated herein by reference in their respective entireties for all purposes,. Such articulating concentrator systems desirably utilize a low overall height for the optical component, so that the concentrators can articulate freely.

As another drawback, parabolic troughs and dishes have aperture regions that are, in practice, unusable for concentrating. This is true for troughs and dishes that have either a bottom focus or an inverted focus. Portions of the apertures of these optical elements are unusable because both the bottom and inverted focusing configurations can be affected by angle of incidence limits at the target focal plane. For example, according to Snell's law, rays striking the target at greater than a certain angle are reflected off the surface and are not absorbed.

FIG. 4 schematically illustrates this issue for a bottom focus reflector 34. Incident rays 36, 38, 40 are concentrated by reflector 34 onto focal plane 32. The angle of incidence with respect to the focal plane 32 of the concentrated rays is greater for rays closer to the optical axis (not shown), which extends through the middle of the reflector 34. Rays 36 and 38 impinge on focal plane 32 at angles less than the acceptance angle of the focal plane 32 and are absorbed. Ray 40 impinges on focal plane 32 at an angle greater than the acceptance angle of the focal plane and is reflected back out of the reflector 34 as ray 42. The same effect would be seen if ray 42 would be incident ray and ray 40 would be the rejected ray. The regions 44 and 46 associated with non-absorbed rays 44 and 42 define the portion of the reflector's 34 aperture that is not usable for concentrating. In practical effect, the effective aperture of the system is reduced.

Inverted focus reflectors suffer from a similar effect except that the aperture penalty occurs near the periphery of the reflector. As schematically illustrated in FIG. 5, incident rays 52, 56, 60 are concentrated by reflector 50 onto focal plane 48. In contrast to the situation with a bottom focus reflector, the angle of incidence with respect to the focal plane 48 of the reflector 50 increases as rays strike reflector 50 further away from the optical axis (not shown), which extends through the middle of the reflector. Rays 52 and 60 impinge on focal plane 48 at angles less than the acceptance angle of the focal plane 48 and are absorbed. Ray 56 impinges on focal plane 48 at an angle greater than the acceptance angle of the focal plane 48 and is reflected back out of the reflector 50 as ray 58. The same effect is seen if ray 58 would be the incident ray and ray 56 would be the rejected ray. The regions 54 and 62 of non-absorbed rays 54 and 62 define the portion of the reflector's aperture that is not usable for concentrating. In practical effect, this limits the width of the reflector's aperture. In addition, as is typical of inverted focus configurations, reflector 50 suffers from self-shadowing such that rays nearest to the optical axis in region 64 are blocked by the target at the focal plane 48 itself, further reducing the light-collecting efficiency of the system.

In addition, articulating concentrator systems desirably would include a means to power the articulating components, preferably using power generated by the device itself. Conventional optical designs can present challenges for photovoltaic devices that would like to use self-powered articulation to aim light concentrating components at the source of incident light, e.g., the sun. It is important that self-powered designs be able to capture and concentrate diffuse light to provide power when the light concentrating components are not aimed properly. Such devices may use bottom focus reflectors in order to provide sufficient optical paths for diffuse radiation to strike a solar cell located at the focal plane. However, as implemented conventionally, this design choice occurs at the expense of the aforementioned limitations of the bottom focus reflector. Devices that instead use inverted focus reflectors, on the other hand, generally provide only very limited optical paths for diffuse radiation to reach the target, as the target, e.g., a solar cell, is facing away from diffuse radiative sources. Also, the reflected field of view in the primary mirror tends to be very narrow. Consequently, inverted focus reflectors tend to collect little diffuse light. These conventional bottom focus and inverted focus reflectors are therefore not well-suited to self-powered systems.

A third type of concentrating primary, a reflective lens as described in Vasylyev, U.S. Pat. No. 6,971,756, includes reflective elements in the form of concentric rings or parallel slats arranged so that incident rays are focused like a lens. These primaries can provide large concentration ratios and may overcome angle of incidence issues present with parabolic troughs and dishes. However, these generally include multiple, precision aligned surfaces that may be cost-prohibitive for medium-scale applications. Additionally, in the case of a long parallel slat form, additional support structure may be required that would tend to create undesirable optical obscurations. Further, in a manner that is analogous to the limitations of a refractive Fresnel lens discussed above, such a design has a limited ability to collect and focus diffuse light to provide for self-powering.

Some attempts have been made in the prior art to improve upon these solutions by combining multiple optical elements into a single concentrator, e.g., as described by Habraken in U.S. Pat. Pub. No. 2004/0134531 and by Cobert in U.S. Pat. Pub. No. 2005/0067008. However, both of these approaches place the multiple optical elements in series, so that light is redirected by multiple elements before reaching the focus. The significant disadvantage of these approaches is that they incur the expense and optical losses of two separate, full-aperture optical elements.

SUMMARY OF THE INVENTION

The present invention provides numerous solutions helpful singly or in combination to overcome and/or alleviate one or more of the problems present in prior art concentrators through the use of a hybrid reflective/refractive optical component. In preferred embodiments, the present invention provides a light collecting and concentrating optical component that includes both refractive and reflective elements. The component is hybrid in the sense that each element handles light collection and focusing for different portions of an aperture of the optical component. At least a portion of the aperture uses a refractive element while another portion of the primary aperture uses a reflective element. Either the reflective and/or referactive elements can be imaging and/or non-imaging. Advantageously, this allows many benefits of both refractive and reflective elements to be realized while avoiding conventional drawbacks.

The optical components of the invention advantageously may serve as a compact, primary optical component for an optical concentrator, especially solar trough or dish concentrators, and more particularly solar trough or dish concentrators that are self-powered and/or articulate. The present invention is applicable to both line and point concentrator systems. For line concentrators the refractive and reflective elements may have a geometry that is symmetric in one direction. For point concentrators the refractive and reflective elements may have a geometry that is symmetric in two directions. In both cases, the direction of symmetry is across the aperture of the concentrator.

In particularly preferred embodiments of this invention, the refractive element of the hybrid optical component is included in a transparent cover that fits over the light receiving end of the reflective element. Such an arrangement offers the significant advantage that the complete concentration system may be protectively enclosed beneath the protective cover and within the walls of the reflector (e.g., reflective trough or dish).

In one aspect, the present invention relates to a hybrid, concentrating optical component. The component includes an aperture; a reflective optical element that collects and focuses light onto a first target for a first portion of the aperture; and a refractive optical element that collects and focuses light onto a second target for a second portion of the aperture.

In another aspect, the present invention relates to a method of making an optical concentrating component. A light reflecting element is provided that collects incident light from a first portion of an aperture and concentrates the light onto a target. A refractive element is provided that captures incident light from a second portion of the aperture and concentrates the light onto the target.

In another aspect, the present invention relates to a method of collecting and concentrating incident light. Light is collected from a first portion of an aperture and reflecting the light from said first portion onto a target. Light also is collected from a second portion of the aperture and refracting the light from said second portion onto the target.

BRIEF DESCRIPTION OF THE DRAWINGS

FIG. 1b is a perspective view of the hybrid optical component of FIG. 1a.

FIG. 7 is a cross section view showing optical pathways for diffuse light in the hybrid optical component of FIG. 1a.

DETAILED DESCRIPTION OF PRESENTLY PREFERRED EMBODIMENT

The embodiments of the present invention described below are not intended to be exhaustive or to limit the invention to the precise forms disclosed in the following detailed description. Rather a purpose of the embodiments chosen and described is so that the appreciation and understanding by others skilled in the art of the principles and practices of the present invention can be facilitated.

Figure 1A:
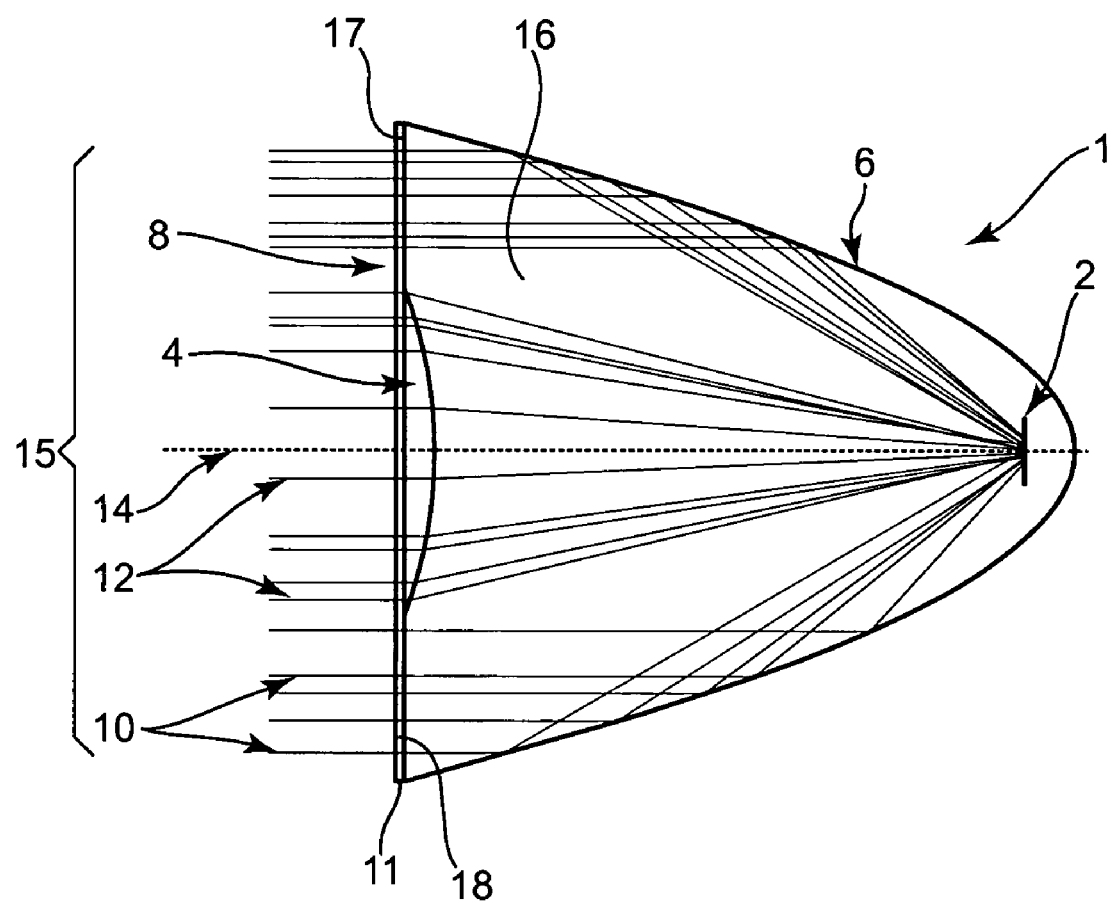
FIG. 1a is a cross section view of a hybrid optical component of the present invention.
Figure 1B:
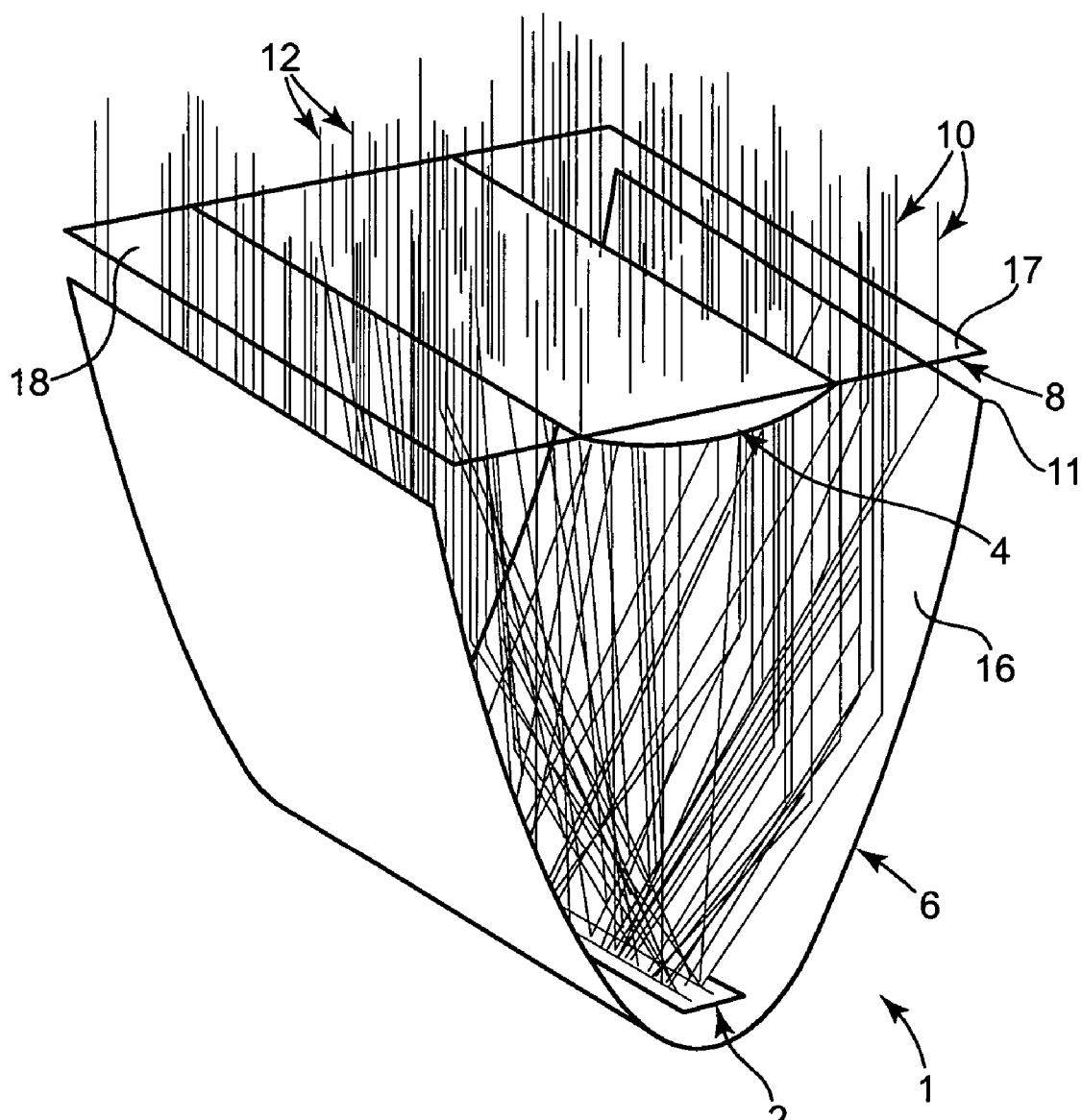
Figure 7:
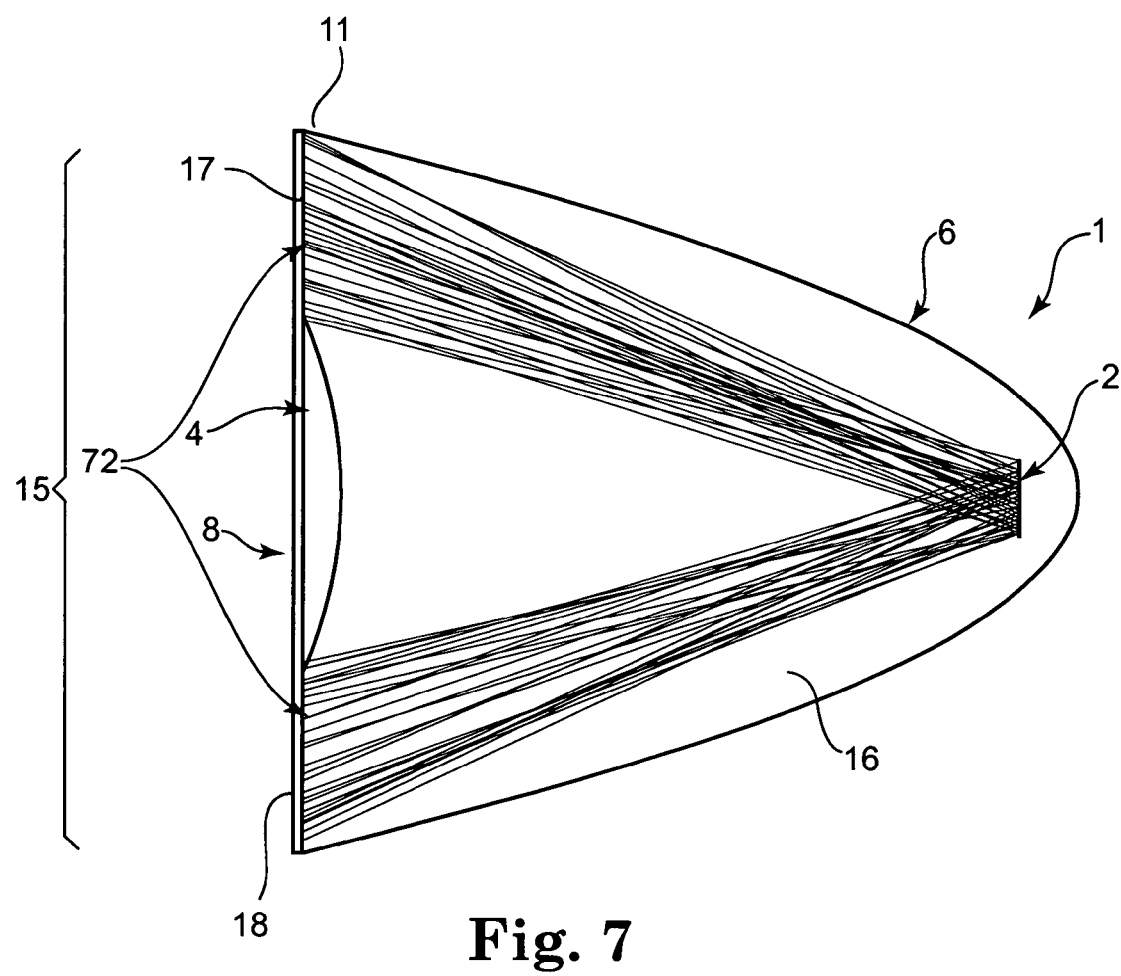

FIGS. 1a, 1b, and 7 show one preferred embodiment of a hybrid primary optical component 1 of this invention. For purposes of illustration optical component 1 is in the form of a line concentrator. The full aperture 15 of component 1 spans the width (in the case of a line concentrator) or diameter (in the case of a point concentrator) of the light receiving end 11 of a reflective element in the form of a bottom focusing dish 6. The hybrid primary optical component 1 includes a cover 8 fitted onto light receiving end 11. Together, the cover 8 and dish 6 provide a protective housing for device components housed in the interior 16.

The reflective surface of dish 6 of the preferred embodiment is nearly parabolic in shape. However, the reflecting element, as an alternative, can use any appropriate reflecting surface including but not limited to surfaces having linear, parabolic, faceted, spherical, elliptical, or hyperbolic profiles.

The cover 8 includes a refractive element in the form of integral plano-convex lens 4 in a central region of cover 8 and transparent, light transmissive outer regions 17 and 18. The lens 4 and dish 6 share a common focal plane 2 and a common optical axis 14. Lens 4 is positioned so that lens 4 is centered about the optical axis 14 of the component 1. The nearly parabolic reflector dish 6 also is centered about the optical axis 14 of the system.

Lens 4 may be of any suitable type including Fresnel and standard types. Even though Fresnel lenses tend to be expensive and lossy, Fresnel lenses are commonly used because a standard lens of the required diameter would be too thick and would use too much expensive and/or heavy optical material. In contrast, the refractive element of the present invention provides concentration for only a fraction of the system aperture 15, thereby allowing a smaller-diameter and thus much thinner lens for the same concentration ratio, as compared to a much thicker, full-aperture lens. As such, the present invention may alternatively employ a standard lens for a range of system apertures that would traditionally require a Fresnel lens. For purposes of illustration, lens 4 is shown as a standard lens.

Figure 2:
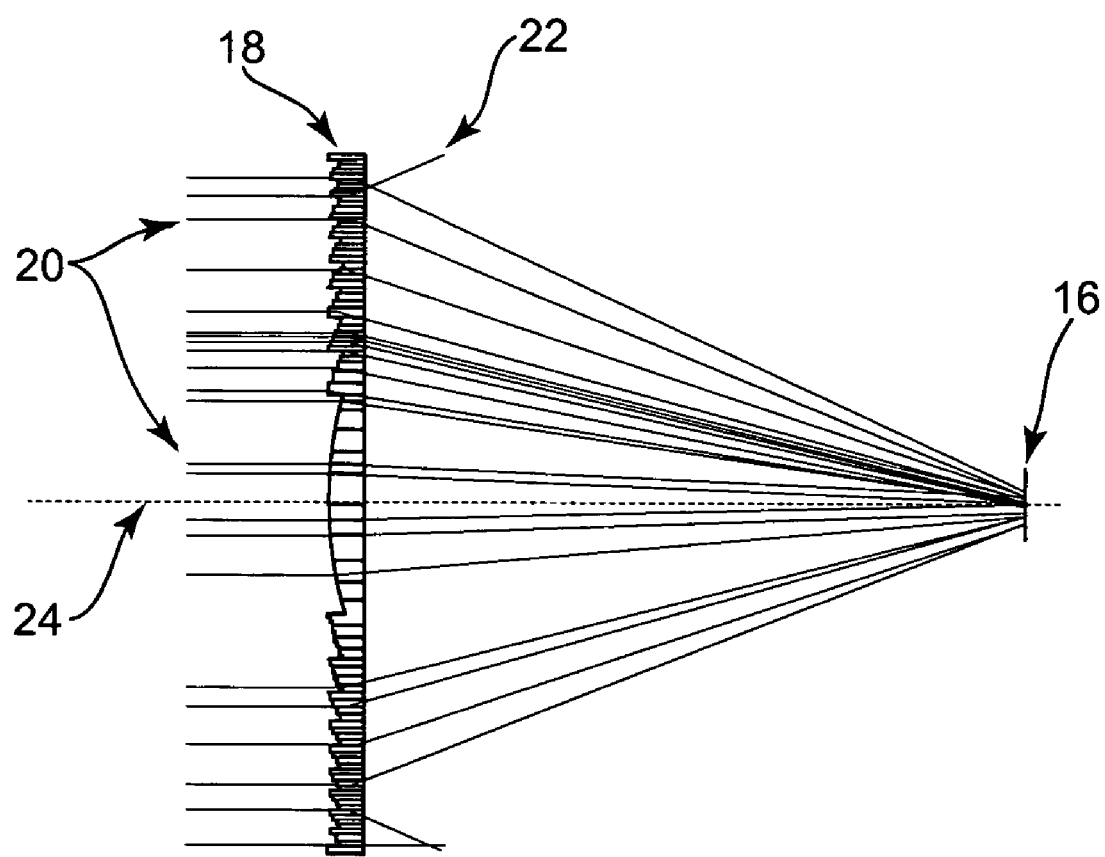
FIG. 2 is a cross-section view of a Fresnel lens refractive concentrator of the prior art.

A comparison between FIG. 1 and FIG. 2 illustrates this advantage given concentrators with, for instance, a 10× geometric concentration in one dimension. Both primary optics (that is, the Fresnel lens primary optic 18 of FIG. 2 and the hybrid primary optical component 1 of FIG. 1 including lens 4 and reflecting dish 6) with normalized apertures of ten (10) units concentrate incident rays 10 and 20, respectively, onto focal planes 2 and 16, respectively, each having a normalized width of one (1) unit. The standard lens element 4 of the hybrid optics of FIG. 1 concentrates a fraction of the total aperture 15 in contrast to the Fresnel lens 18 of FIG. 2, which concentrates the entire aperture. In the hybrid optical component 1 of FIG. 1, the portion of the aperture not concentrated by lens 4 is concentrated by reflecting dish 6. Consequently, the embodiments of the present invention that use a standard, yet thin, standard lens 4 to concentrate only a portion of the aperture 15 may reduce the system cost. In this regard, compare the large thick, full aperture, standard lens of Cobert, U.S. patent application Ser. No. 2005/0067008, to the much smaller and thinner lens 4 of FIG. 1. The hybrid optics approach of FIG. 1 also may improve optical throughput by eliminating the loss associated with discontinuities present with a full aperture Fresnel lens. Such losses are illustrated by the improperly refracted ray 22 in FIG. 2.

Advantageously, each optical element of the hybrid primary optical component 1, i.e., lens 4 and dish 6 in this embodiment, serves as the primary optic for its respective portion of the collecting aperture 15. This differentiates component 1 from and improves upon multi-stage concentrators that incorporate refractive and reflective components only in series.

For example, in use, incident rays 12 that are incident upon the central portion of the collecting aperture 15 pass through lens 4 of cover 8 and are thereby refractively focused by lens 4 onto the common focal plane 2. In the meantime, incident rays 10 that are incident upon the outer portions 17 and 18 of the collecting aperture 15 pass through cover 8 and are focused by the reflecting dish 6 onto the common focal plane 2. In other words, incident rays 12 are concentrated by lens 4 and not by the dish 6, while incident rays 10 are concentrated by the dish 6 and not by the lens 4.

Figure 3:
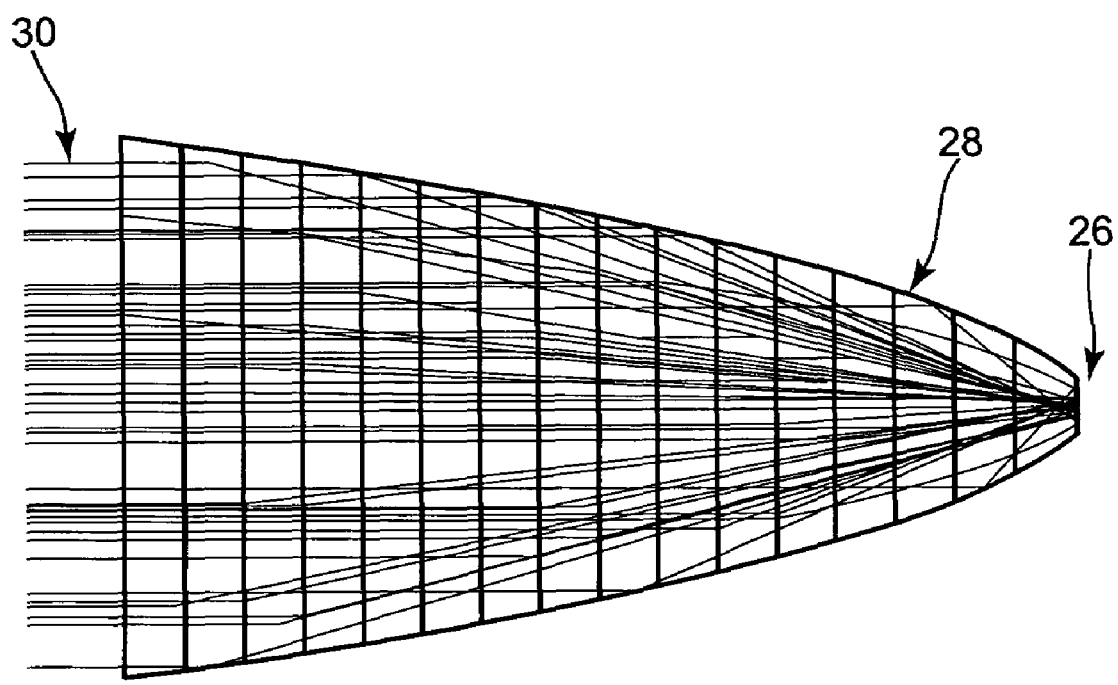
FIG. 3 is a cross section view of a compound parabolic concentrator of the prior art.

The hybrid approach provides numerous advantages. First, CPC reflector concentrators in which only a reflector is provided to serve a full aperture, as shown in FIG. 3, tend to be too tall to be well suited to applications in which the concentrators must articulate within close proximity of one another. In contrast, as illustrated in FIG. 1, the present invention enables concentrator designs that have comparable concentrating power to a CPC design at lower height/width ratios, e.g., a height/width ratio of one (1), making the hybrid approach well suited to applications in which an array of concentrators must articulate within close proximity of one another.

As another advantage, the present invention requires no additional obscuring support structure. In contrast, the reflective lens of Vasylyev, U.S. Pat. No. 6,971,756 requires multiple precision aligned surfaces and support structures.

Hybrid optics of the present invention also are very compatible for use with self-powered, articulating optical concentrators, because the present invention provides sufficient paths for diffuse radiation to reach the focus plane 2. This is best seen in FIG. 7. Because the total aperture 15 of the hybrid optical component of the present invention is larger than the lens aperture, there exist optical paths not parallel to the optical axis 14, through the cover element 8, that neither strike the refractive element 4 nor the reflective dish 6. These optical paths allow diffuse radiation 72 to be directly absorbed by a solar cell located at the focal plane 2. This helps an articulating optical concentrator that includes the hybrid optical component to generate sufficient self-power to articulate itself even when not pointed at the sun. In contrast, inasmuch as full aperture Fresnel refractors typically allow only a small amount of diffuse light to reach the focal plane, full aperture Fresnel-refractor systems are generally not well suited to self-powering.

Figure 4:
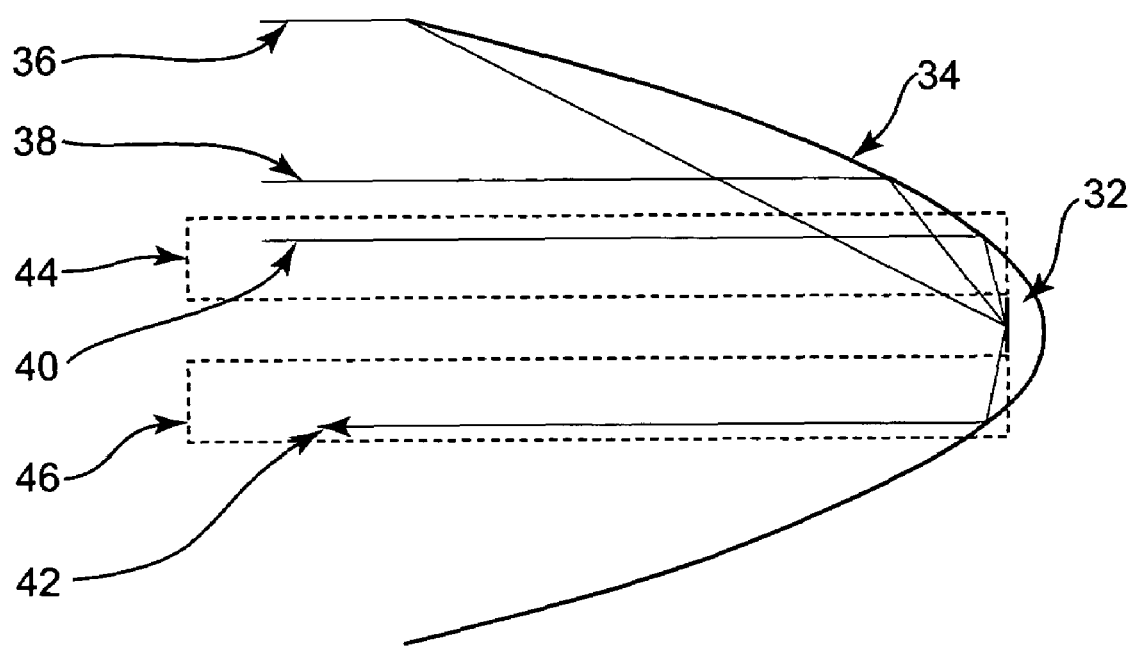
FIG. 4 is a cross section view of a bottom focus parabolic reflector of the prior art.
Figure 5:
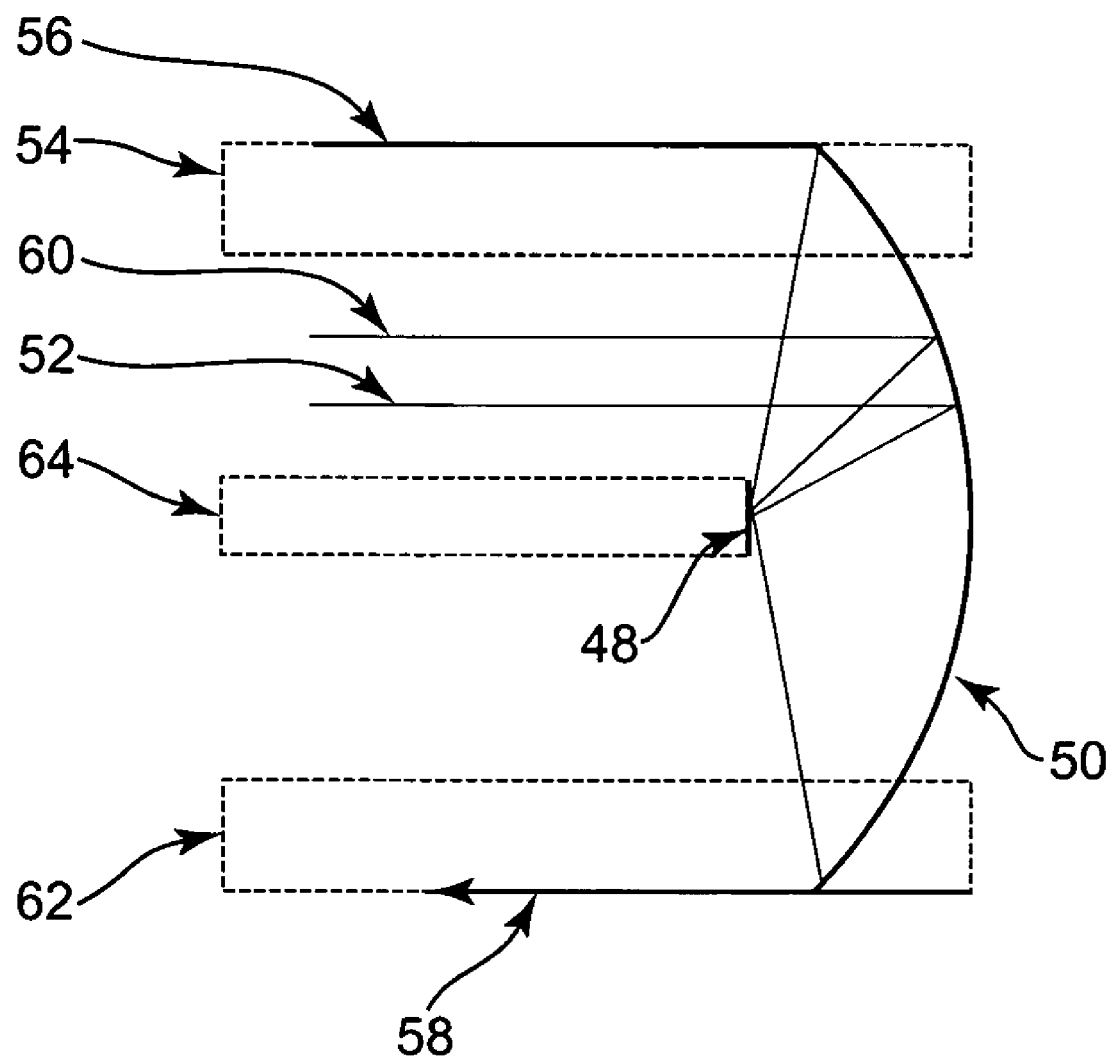
FIG. 5 is a cross section view of an inverted focus parabolic reflector of the prior art.

The use of hybrid optics in accordance with the present invention also avoids a key drawback conventionally associated with full aperture reflective components. If a reflective element is used by itself to serve a full aperture, as explained above with respect to FIGS. 3 and 4, the aperture would include regions associated with non-absorbed rays. These regions correspond to portions of the aperture that are not available for concentrating in a conventional system. Specifically, conventional bottom focus and inverted focus reflectors serving the full aperture tend to have a poor acceptance angle for incident light in certain regions of the aperture and, as a consequence, tend to be poorly suited to self-powering applications.

In contrast, the present invention overcomes the above limitations of both bottom and inverted focus reflectors by using refractive concentrating for the portions of the system aperture where the reflector is not suitable. Thus, the lens 4 of the hybrid optical component 1 of the present invention is positioned in those regions of aperture 15 to collect and concentrate corresponding incident light that otherwise would be unused. The full aperture 15 not only is used for collecting and focusing (a feat which is not accomplished with a full aperture reflective element used by itself), but also the optics can further capture diffuse light for self-powering (a feat which is not accomplished with a full aperture refractive element such as a lens). The ability to capture and concentrate light using the full aperture also helps self-powering performance. In practical effect, the hybrid approach provides the benefits of both a reflector and a refractor without the major drawbacks of either.

In one preferred embodiment, the cover 8 and lens 4 are 5 inches wide and may be constructed of acrylic or methacrylic, and the trough is 5 inches wide and 5 inches deep and may be constructed of high-reflectivity, aluminum sheet metal manufactured by Alanod under the trade name MIRO (distributed by Andrew Sabel, Inc., Ketchum, Id.). In the preferred embodiment of optical component 1 shown in FIGS. 1*a*, 1*b*, and 7, the hybrid optical component forms the primary optic for the concentrator system, and light redirected by the hybrid optical component 1 directly strikes the target surface at focal plane 2. In alternative forms of this invention, the light redirected by this primary optic optionally may be further redirected by additional optics, or may be redirected by one or more pre-primary optics prior to reaching this primary optic. For example, alternative embodiments may include additional optical elements (not shown) intended to help steer diffuse radiation 72 through the clear regions of the cover 8. As another option, reflectors could be added outside of the enclosed space of the concentrator module to help direct additional diffuse radiation through the clear regions of the cover 8 to the focal plane 2.

Figure 6:
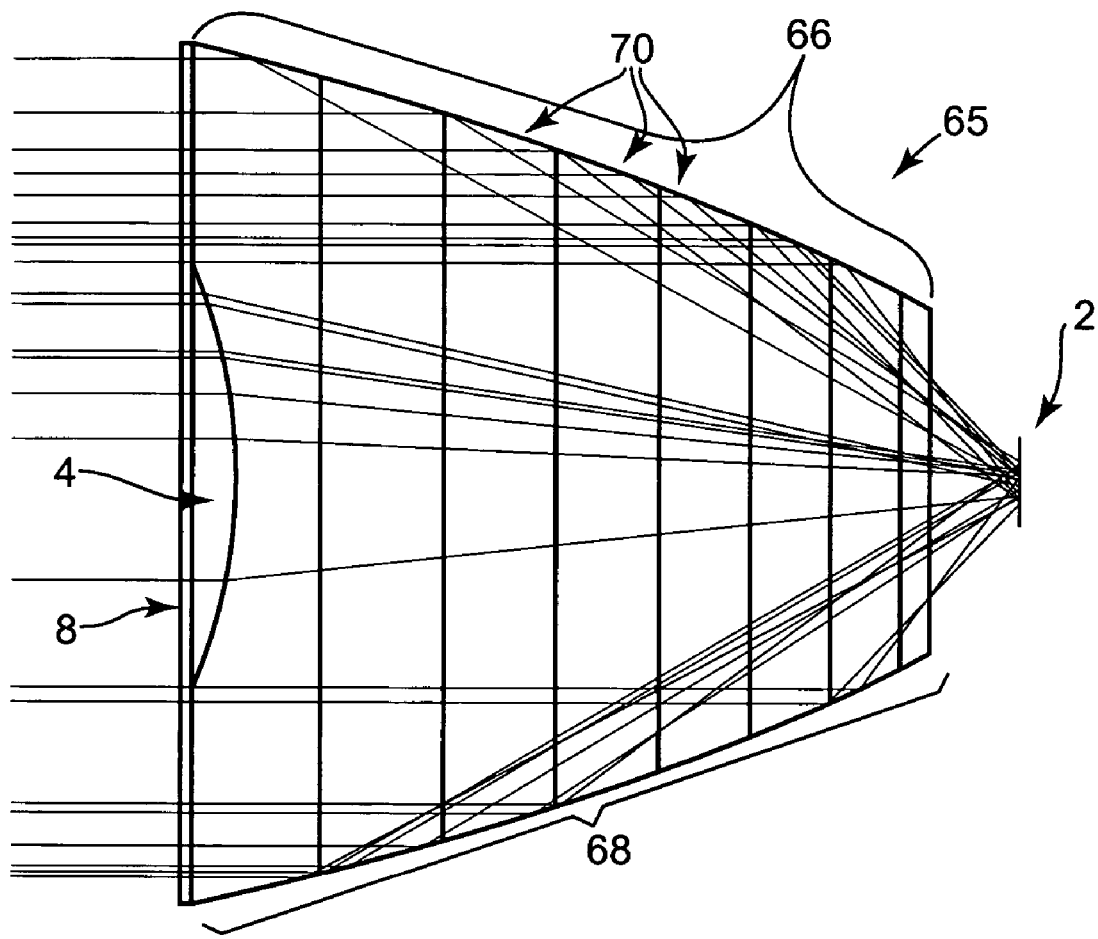
FIG. 6 is a cross section view of a faceted trough form of a hybrid optical component of the present invention.

In another alternate form of this invention, the individual reflective or the refractive elements of the hybrid optical component may be replaced by multiple distinct individual elements, each focusing its own portion of the input aperture, by way of example, using a faceted refractive lens with a parabolic or faceted-parabolic reflector. For instance, another alternate form of an optical component 65 of the present invention uses two faceted but monolithic reflectors 66 and 68 illustrated in FIG. 6. Each reflector 66, 68 includes a plurality of facets 70, each having a continuous profile that may include but is not limited to linear, spherical, parabolic, elliptical, and hyperbolic profiles. Faceted reflectors are advantageous in that they are non-imaging and may be designed to concentrate light more evenly across the focal plane 2. As the reflective element is composed of two disjoint reflectors this also helps to eliminate reflector material in the portion of the component aperture that is concentrated by the refractive element 4, possibly reducing cost.

In accordance with a preferred mode of practice, the facet coordinates can be determined by a methodology that uses the following parameters:

$Y_{cell}$—Half width of the target cell or focal plane $\emptyset$—Acceptance half angle (radians). This is the angle relative to the optical axis in which incident rays are still concentrated onto the target surface.

$Y_{max}$—Half width of the reflector $Z_{max}$—Reflector height relative to the target surface.

The solution for each facet coordinate is an iterative process that begins with the outermost coordinate defined by $(Y_{max}, Z_{max})$. The first step is to compute the facet slope such that the an incident ray impinging on the top of the facet at an angle of $+\emptyset$ from the optical axis results in a reflected ray that impinges the cell at a position $-Y_{cell}$. The second step is to solve for the (y,z) coordinate of the facet bottom using the facet slope previously computed such that an incident ray impinging at the facet bottom at the angle $-\emptyset$ from the optical axis results in a reflected ray that impinges the cell at a position $+Y_{cell}$. These two steps are then repeated for each facet using the bottom (y,z) coordinate of the previous facet as the top coordinate of the next facet. The equations for these two steps are as follows:

$$m_i = \tan\left(\frac{\pi - \arctan\left(\frac{y_i - y_i^=}{z_i}\right) + \phi}{2}\right) \quad 1)$$

Where: $y_i^- = -Y_{cell}$ and $m_i$ is the slope of the facet whose top coordinate is $(y_i, z_i)$.

$$y_i = \frac{y_i^+ + (z_{i-1} - m_{i-1} y_{i-1})\tan(\pi - 2\arctan(m_{i-1}) - \phi)}{1 - m_{i-1}\tan(\pi - 2\arctan(m_{i-1}) - \phi)} \quad 2)$$

Where: $y_i^+ = Y_{cell}$

The following coordinates for a representative, faceted reflector can therefore be determined given:

Ycell=0.25"
Ø=2.1 degrees
$(y_0, z_0)$=(2.5",5")

| Facet # | y (in) | z (in) | m |
| --- | --- | --- | --- |
| 1 | 2.5 | 5 | 4.212103 |
| 2 | 2.45662 | 4.817277 | 4.128815 |
| 3 | 2.400028 | 4.583623 | 4.020582 |
| 4 | 2.326947 | 4.289793 | 3.881534 |
| 5 | 2.233829 | 3.92835 | 3.705591 |
| 6 | 2.117269 | 3.496428 | 3.487403 |
| 7 | 1.974757 | 2.999432 | 3.223974 |
| 8 | 1.80587 | 2.454945 | 2.917091 |
| 9 | 1.613921 | 1.895013 | 2.576414 |
| 10 | 1.407809 | 1.363981 | 2.222312 |
| 11 | 1.20313 | 0.909121 | 1.885937 |

Figure 8:
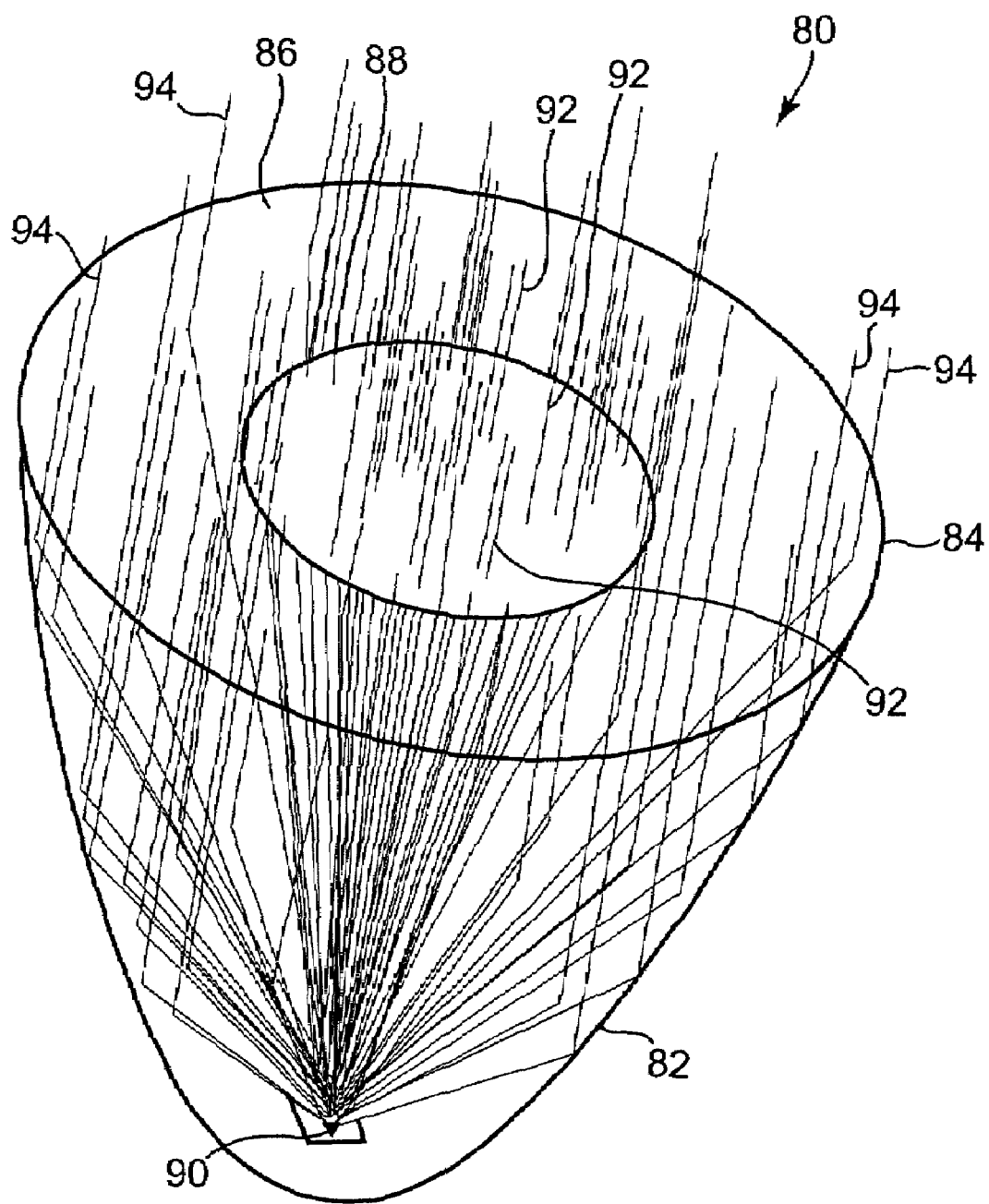
FIG. 8 is a perspective view of a point concentrator incorporating a hybrid optic component of the present invention.

FIG. 8 shows another embodiment of a hybrid optical component 80 of the present invention that is in the form of a point concentrator. Component 80 includes a generally parabolic reflector dish 82 having light receiving end 84. Light transmissive cover 86 is fitted over light receiving end 84 and includes a light refractive element in a central region in the form of lens 88. Lens 88 is integral with cover 86. The dish 82 and lens 88 share a common focal point 90. In use, incident light rays 92 that impinge upon lens 88 are refracted and concentrated onto focal point 90. In the meantime, incident light rays 94 pass through cover 86 and are then reflectively concentrated by dish 82 onto the common focal point 90. Thus, dish 82 and lens 88 serve different portions of the full aperture of hybrid optical component 80.

All cited patents and patent publications are incorporated herein by reference in their respective entireties for all purposes.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

The invention claimed is:

1. A hybrid, concentrating optical component, comprising:
  i. an aperture;
  ii. a reflective optical element that collects and focuses light onto a first target for a first portion of the aperture; and
  iii. a refractive optical element that collects and focuses light onto a second target for a second portion of the aperture,
wherein at least one of the first and second targets is an aperture of one or more secondary optics.

2. The hybrid concentrating optical component of claim 1, wherein the first and second targets are the same.

3. The hybrid concentrating optical component of claim 1, wherein the first and second targets comprise a portion of a common focal plane.

4. The hybrid concentrating optical component of claim 3, wherein the common focal plane is proximal to a bottom focus of the optical system.

5. The hybrid concentrating optical component of claim 1, wherein the component concentrates light onto a line.

6. The hybrid concentrating optical component of claim 1, wherein the component concentrates light onto a point.

7. The hybrid concentrating optical component of claim 1, wherein the component is a constituent of a system that is self powered.

8. The hybrid concentrating optical component of claim 1, wherein the component is a constituent of a system that includes a plurality of articulating modules, said optical component concentrating light for at least one of said modules.

9. The hybrid concentrating optical component of claim 1, wherein the reflective element is a bottom focusing, reflective dish.

10. The hybrid concentrating optical component of claim 1, wherein the reflective element is a bottom focusing reflective trough.

11. A hybrid, concentrating optical component, comprising:
  i. an aperture;
  ii. a reflective optical element that collects and focuses light onto a first target for a first portion of the aperture; and
  iii. a refractive optical element that collects and focuses light onto a second target for a second portion of the aperture, wherein the refractive element comprises a fresnel lens.

12. The hybrid concentrating optical component of claim 11, wherein the fresnel lens concentrates light onto a line.

13. The hybrid concentrating optical component of claim 11, wherein the fresnel lens concentrates light onto a point.

14. The hybrid concentrating optical component of claim 1, wherein the refractive optical element and the reflective optical element have a common optical axis.

15. The hybrid concentrating optical component of claim 14, wherein the refractive element is centered upon the common optical axis.

16. The hybrid concentrating optical component of claim 2, wherein the component comprises an aperture region associated with reflected light that passed through said aperture region and that is non-absorbed by the target, and wherein the refractive optical element is positioned in a manner effective to cause refracted light that passes through said aperture region to be absorbed by the target.

17. The hybrid concentrating optical component of claim 1, wherein a cover fits over a light receiving end of the reflective optical component, said cover incorporating the refractive optical element.

18. The hybrid concentrating optical component of claim 1, wherein the refractive element is positioned in a portion of the aperture that is unusable by the reflective element for concentration.

19. The hybrid concentrating optical component of claim 1, wherein the refractive element is a lens.

20. The hybrid concentrating optical component of claim 1, wherein the refractive element is a fresnel lens.

21. The hybrid concentrating optical component of claim 1, wherein the reflective element is a reflecting surface that has a geometry selected from a linear, parabolic, spherical, elliptical, and hyperbolic profile.

22. A hybrid, concentrating optical component, comprising:
  i. an aperture;
  ii. a reflective optical element that collects and focuses light onto a first target for a first portion of the aperture, wherein said reflective optical element comprises first and second reflective optical elements, each element collecting and concentrating incident light for respective portions of the first portion of the aperture; and
  iii. a refractive optical element that collects and focuses light onto a second target for a second portion of the aperture.

23. A hybrid, concentrating optical component, comprising:
  i. an aperture;
  ii. a reflective optical element that collects and focuses light onto a first target for a first portion of the aperture, wherein the reflective optical element comprises a plurality of facets; and
  iii. a refractive optical element that collects and focuses light onto a second target for a second portion of the aperture.

24. A hybrid, concentrating optical component, comprising:
  i. an aperture;
  ii. a reflective optical element that collects and focuses light onto a first target for a first portion of the aperture;
  iii. a refractive optical element that collects and focuses light onto a second target for a second portion of the aperture; and
  iv. a path for diffuse radiation to reach a target surface.

25. The hybrid concentrating optical component of claim 24, wherein the optical path for diffuse radiation impinges on the target surface without being reflected onto the target surface.

26. The hybrid concentrating optical component of claim 25, wherein the optical path for diffuse radiation impinges on the target surface without being refracted onto the target surface.

27. The hybrid concentrating optical component of claim 11, wherein the first and second targets are the same.

28. The hybrid concentrating optical component of claim 11, wherein a cover fits over a light receiving end of the reflective optical component, said cover incorporating the refractive optical element.

29. The hybrid concentrating optical component of claim 11, wherein the refractive element is positioned in a portion of the aperture that is unusable by the reflective element for concentration.

30. The hybrid concentrating optical component of claim 22, wherein the first and second targets are the same.

31. The hybrid concentrating optical component of claim 22, wherein a cover fits over a light receiving end of the reflective optical component, said cover incorporating the refractive optical element.

32. The hybrid concentrating optical component of claim 22, wherein the refractive element is positioned in a portion of the aperture that is unusable by the reflective element for concentration.

33. The hybrid concentrating optical component of claim 23, wherein the first and second targets are the same.

34. The hybrid concentrating optical component of claim 23, wherein a cover fits over a light receiving end of the reflective optical component, said cover incorporating the refractive optical element.

35. The hybrid concentrating optical component of claim 23, wherein the refractive element is positioned in a portion of the aperture that is unusable by the reflective element for concentration.

36. The hybrid concentrating optical component of claim 24, wherein the first and second targets are the same.

37. The hybrid concentrating optical component of claim 24, wherein a cover fits over a light receiving end of the reflective optical component, said cover incorporating the refractive optical element.

38. The hybrid concentrating optical component of claim 24, wherein the refractive element is positioned in a portion of the aperture that is unusable by the reflective element for concentration.

* * * * *

UNITED STATES PATENT AND TRADEMARK OFFICE
CERTIFICATE OF CORRECTION

PATENT NO. : 7,688,525 B2 Page 1 of 1
APPLICATION NO. : 11/654131
DATED : March 30, 2010
INVENTOR(S) : Hines et al.

It is certified that error appears in the above-identified patent and that said Letters Patent is hereby corrected as shown below:

Column 10
Line 41, "." should be --,--.

Signed and Sealed this

Tenth Day of August, 2010

David J. Kappos
*Director of the United States Patent and Trademark Office*